(12) United States Patent
Hirano

(10) Patent No.: US 7,592,232 B2
(45) Date of Patent: Sep. 22, 2009

(54) METHOD FOR MANUFACTURING SEMICONDUCTOR DEVICE

(75) Inventor: Tomoyuki Hirano, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 12/144,752

(22) Filed: Jun. 24, 2008

(65) Prior Publication Data

US 2009/0023261 A1    Jan. 22, 2009

(51) Int. Cl.
*H01L 21/8234* (2006.01)
(52) U.S. Cl. ..................... 438/301; 438/954
(58) Field of Classification Search ............. 438/301, 438/303, 305, 954
See application file for complete search history.

(56) References Cited

U.S. PATENT DOCUMENTS

| 6,849,511 | B2 * | 2/2005 | Iriyama et al. | ............... 438/275 |
| 7,091,118 | B1 * | 8/2006 | Pan et al. | ..................... 438/592 |

FOREIGN PATENT DOCUMENTS

| JP | 2001-308318 | 11/2001 |
| JP | 2004/097943 | 11/2004 |
| JP | 2005-303256 | 10/2005 |

* cited by examiner

*Primary Examiner*—Richard A. Booth
(74) *Attorney, Agent, or Firm*—Sonnenschein Nath & Rosenthal LLP

(57) ABSTRACT

A method for manufacturing a semiconductor device, includes the steps of forming a dummy gate insulating film and a dummy gate electrode, forming source and drain regions, forming a first insulating film, forming a second insulating film, removing the second insulating film, simultaneously removing the first insulating film and the second insulating film that remains, while planarizing the first insulating film and the second insulating film that remains, forming a gate electrode trench by removing the dummy gate electrode and the dummy gate insulating film, forming a gate insulating film, and forming a gate electrode, wherein a field effect transistor is formed by the method.

8 Claims, 13 Drawing Sheets

METHOD FOR MANUFACTURING SEMICONDUCTOR DEVICE

CROSS REFERENCES TO RELATED APPLICATIONS

The present invention contains subject matter related to Japanese Patent Application JP 2007-189391 filed with the Japan Patent Office on Jul. 20, 2007, the entire contents of which being incorporated herein by reference.

BACKGROUND OF THE INVENTION

1. Field of the Invention

The present invention relates to methods for manufacturing a semiconductor device, and particularly to a method for manufacturing a semiconductor device having a field effect transistor.

2. Description of Related Art

A damascene process is known as an interconnect forming method in a method for manufacturing a semiconductor device.

In the damascene process, for example, a gate electrode trench is formed in an insulating film over a substrate, and an electrically-conductive material is so deposited as to fill the inside of the gate electrode trench. Subsequently, chemical mechanical polishing (CMP) treatment or the like is performed to thereby remove the conductive material outside the gate electrode trench while leaving the conductive material in the gate electrode trench, so that the left conductive material will be used as an interconnect.

Miniaturization of a metal-oxide-semiconductor field effect transistor (MOSFET, hereinafter referred to as a MOS transistor), which is a basic element in a semiconductor device, is being advanced along with the progression of miniaturization and integration degree enhancement of semiconductor devices. Thus, the thickness of the gate insulating film as well as the gate length needs to be decreased in accordance with the scaling rule.

Although a SiON insulating film is often used as the gate insulating film, it is difficult to use the SiON insulating film as the gate insulating film for the 32-nm generation and subsequent generations because large leakage will arise.

To address this problem, studies are being made on a method in which a high dielectric constant film (so-called High-k film), which allows large physical thickness, is used as the material of the gate insulating film.

Typically, the heat resistance of the High-k film is low, and therefore the gate insulating film formed of the High-k film needs to be formed after thermal diffusion treatment for the source and drain regions, which requires a high temperature.

As a method permitting such a procedure, a damascene gate process is known, in which the gate electrode of a MOS transistor is formed by using the above-described damascene process.

Methods of forming a MOS transistor by using the damascene gate process are disclosed in Japanese Patent Laid-open No. 2005-303256, PCT Patent Publication No. WO2001/097943, and Japanese Patent Laid-open No. 2001-308318.

One example of a manufacturing method based on the damascene gate process will be described below.

Initially, steps until the structure shown in FIG. 10A is obtained will be described.

For example, in a silicon semiconductor substrate 100 having a channel forming region, an element-isolation insulating film 101 for separating active regions is formed by shallow trench isolation (STI).

Subsequently, silicon oxide is formed over the entire surface by e.g. thermal oxidation, and poly-silicon is deposited by chemical vapor deposition (CVD). Furthermore, silicon nitride is deposited. Subsequently, etching processing is carried out by photolithography for the entire surface except for the gate forming region, to thereby stack a dummy gate insulating film 102 composed of silicon oxide, a dummy gate electrode 103 composed of poly-silicon, and a hard mask layer 104 composed of silicon nitride over the gate electrode forming region in the active region of the semiconductor substrate 100.

Next, for example, offset spacers 105 are formed on both the sides of the dummy gate electrode 103 by depositing silicon nitride over the entire surface by CVD and performing etch-back for the entire surface.

Next, for example, pocket layers (not shown) and extension regions 106 are formed in the semiconductor substrate 100 by ion-implantation of an impurity into the active region with use of the offset spacers 105 and the hard mask layer 104 as the implantation mask.

Subsequently, for example, silicon nitride is deposited over the entire surface by plasma CVD and silicon oxide is deposited, followed by etch-back for the entire surface. Thereby, sidewall spacers formed of a silicon nitride film 107a and a silicon oxide film are formed on both the sides of the offset spacers 105.

Next, for example, source and drain regions 109 are formed in the semiconductor substrate 100 by ion-implantation of an impurity into the active region with use of the sidewall spacers, the offset spacers 105, and the hard mask layer 104 as the implantation mask.

Thereafter, the resist film is separated, and the silicon oxide film as a part of the sidewall spacers and the other exposed silicon oxide film are removed by diluted hydrofluoric acid (DHF) treatment. Furthermore, thermal treatment such as spike rapid thermal annealing (RTA) treatment (1050° C.) is carried out for activation of the impurities.

Subsequently, for example, a refractory metal such as cobalt is deposited by sputtering over the entire surface, and silicidation across the interface between the silicon and the refractory metal on the surface of the source and drain regions is caused by RTA treatment, so that a refractory metal silicide layer 110 is formed. Thereafter, the unreacted refractory metal is removed.

Through the above-described steps, the structure shown in FIG. 10A is obtained.

Although the silicon oxide film as a part of the sidewall spacers is removed by the above-described DHF treatment, the component formed only of the silicon nitride film 107a will also be often referred to as the sidewall spacer, hereinafter.

Referring next to FIG. 10B, for example, silicon oxide is so deposited by CVD over the entire surface that the sidewall spacers, the offset spacers 105, and the hard mask layer 104 are covered, to thereby form a first interlayer insulating film 111.

Next, as shown in FIG. 11A, polishing is carried out by chemical mechanical polishing (CMP) from the top surface side until the surface of the dummy gate electrode 103 is exposed.

Subsequently, as shown in FIG. 11B, for example, the dummy gate electrode 103 and the dummy gate insulating film 102 are removed by etching treatment under a predetermined condition. Due to this step, a gate electrode trench T is formed in the part in which the dummy gate electrode 103 and the dummy gate insulating film 102 existed.

The above-described etching includes a step of removing the dummy gate electrode composed of silicon oxide by etching. Therefore, the first interlayer insulating film 111 composed of silicon oxide is etched from its surface and thus the surface level thereof lowers toward the semiconductor substrate 100.

Subsequently, as shown in FIG. 12A, for example, a gate insulating film 113 composed of hafnium oxide or the like is so formed over the entire surface as to cover the inside of the gate electrode trench T by atomic layer deposition (ALD).

Next, for example, an electrically-conductive layer 114 is formed by depositing tungsten or the like on the gate insulating film 113 across the entire surface by sputtering, CVD, or the like in such a manner as to fill the gate electrode trench T.

Subsequently, as shown in FIG. 12B, for example, polishing or the like is performed from the top surface of the conductive layer 114 to thereby remove the conductive layer 114 deposited outside the gate electrode trench T, so that a gate electrode 114a is formed in the gate electrode trench T.

As a result of this step, because the surface level of the first interlayer insulating film 111 has lowered as described above, a conductive layer residue 114r and a gate insulating film residue 113r are left outside the gate electrode trench T and above the source and drain regions 109.

Subsequently, as shown in FIG. 13A, for example, a second interlayer insulating film 115 is formed by depositing silicon oxide over the entire surface by CVD. Next, as shown in FIG. 13B, opening of contact holes CH that reach the source and drain regions is attempted. However, because the conductive layer residue 114r is left above the source and drain regions 109 as described above, the opening of the contact holes finishes at the timing when the contact holes reach the conductive layer residue 114r.

Furthermore, the conductive layer residue 114r will cause short-circuiting.

SUMMARY OF THE INVENTION

The problem required to be solved by the present invention is that a conductive layer residue is left attributed to the lowering of the surface level of an interlayer insulating film at the time of the formation of the gate electrode trench in the above-described damascene gate process and this conductive layer residue makes it difficult to open contact holes and will cause short-circuiting.

According to an embodiment of the present invention, there is provided a method for manufacturing a semiconductor device. The method includes the steps of forming a dummy gate insulating film and a dummy gate electrode over a semiconductor substrate having a channel forming region, forming source and drain regions in the semiconductor substrate by using the dummy gate electrode as a mask, and forming a first insulating film by using an insulating material having higher resistance against a hydrofluoric acid than silicon oxide in such a way that the first insulating film has a thickness larger than a thickness of the dummy gate electrode and covers the dummy gate electrode. The method further includes the steps of forming a second insulating film on the first insulating film by using an insulating material different from the insulating material of the first insulating film, removing the second insulating film from the top surface of the second insulating film until the top part of the first insulating film is exposed, and simultaneously removing the first insulating film and the second insulating film that remains, while planarizing the first insulating film and the second insulating film that remains, from the top surface of the first insulating film until the dummy gate electrode is exposed.

The method further includes the steps of forming a gate electrode trench by removing the dummy gate electrode and the dummy gate insulating film, forming a gate insulating film on the bottom of the gate electrode trench, and forming a gate electrode by filling the inside of the gate electrode trench above the gate insulating film with an electrically-conductive material. A field effect transistor is formed by the method.

In the method for manufacturing a semiconductor device according to the embodiment of the present invention, initially the dummy gate insulating film and the dummy gate electrode are formed over the semiconductor substrate having the channel forming region, and then the source and drain regions are formed in the semiconductor substrate by using the dummy gate electrode as a mask.

Subsequently, the first insulating film is formed by using an insulating material having higher resistance against a hydrofluoric acid than silicon oxide in such a way that the first insulating film has a thickness larger than that of the dummy gate electrode and covers the dummy gate electrode. On the first insulating film, the second insulating film is formed by using an insulating material different from that of the first insulating film. Subsequently, the second insulating film is removed from the top surface of the second insulating film until the top part of the first insulating film is removed, and then the first insulating film and the remaining second insulating film are simultaneously removed, while being planarized, from the top surface of the first insulating film until the dummy gate electrode is exposed.

Subsequently, the gate electrode trench is formed by removing the dummy gate electrode and the dummy gate insulating film. The gate insulating film is formed on the bottom of the gate electrode trench, and then the gate electrode is formed by filling the inside of the gate electrode trench above the gate insulating film with an electrically-conductive material.

In this manner, a field effect transistor is formed.

In the method for manufacturing a semiconductor device according to the embodiment of the present invention, the lowering of the surface level of the interlayer insulating film at the time of the formation of the gate electrode trench does not occur in the above-described damascene gate process. Thus, a conductive layer residue that possibly causes short-circuiting is not generated, and therefore contact holes can be easily opened.

DETAILED DESCRIPTION OF THE PREFERRED EMBODIMENT

A method for manufacturing a semiconductor device according to an embodiment of the present invention will be described below with reference to the drawings.

Figure 1:
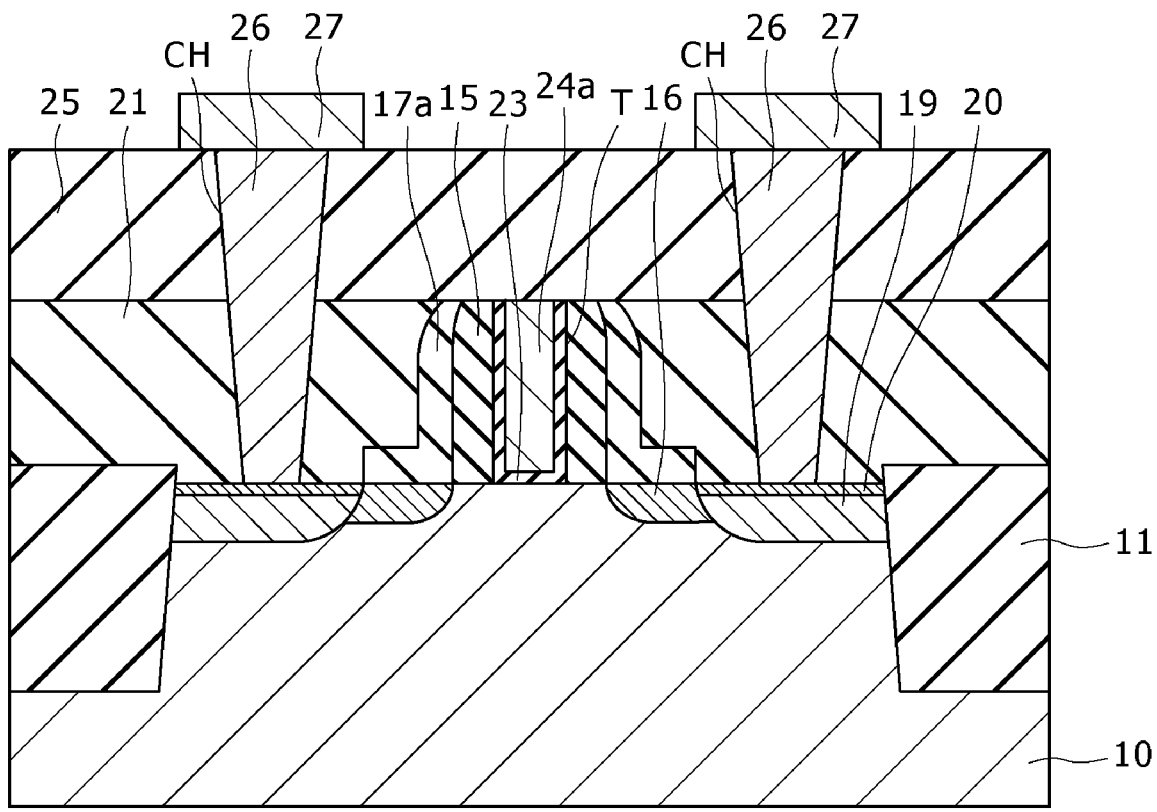
FIG. 1 is a schematic sectional view of a semiconductor device according to an embodiment of the present invention.

FIG. 1 is a schematic sectional view of a semiconductor device according to the present embodiment.

In this semiconductor device, for example, in a silicon semiconductor substrate 10 having a channel forming region, an element-isolation insulating film 11 for separating active regions is formed by shallow trench isolation (STI). Over the semiconductor substrate 10, a pair of offset spacers 15 that are separated from each other by a predetermined distance and are composed of silicon nitride or the like are formed. On both the sides of the offset spacers 15, a pair of sidewall spacers 17a composed of silicon nitride or the like are formed. On both the sides of the sidewall spacers 17a, a first insulating film 21 composed of silicon nitride or the like is formed.

For example, the area between the pair of offset spacers 15 serves as a gate electrode trench T. On the bottom of the gate electrode trench T, a gate insulating film 23 is formed. The gate insulating film 23 is composed of silicon oxide or is formed of a so-called High-k film composed of a material having a dielectric constant higher than that of silicon oxide, such as hafnium oxide or aluminum oxide. On the gate insulating film 23, a gate electrode 24a is so formed as to be buried in the gate electrode trench T. The gate electrode 24a is composed of any of the following materials: poly-silicon; a metal selected from the group consisting of tungsten, hafnium, tantalum, titanium, molybdenum, ruthenium, nickel, and platinum; an alloy containing the metal; and a compound of the metal.

For example, source and drain regions 19 having extension regions 16 are formed in a partial portion of the semiconductor substrate 10 below at least the offset spacers 15 and the sidewall spacers 17a. On the surface of the source and drain regions 19, a refractory metal silicide layer 20 composed of e.g. NiSi is formed.

Based on this structure, a field effect transistor is formed.

An upper insulating film 25 composed of silicon oxide or the like is formed on the gate electrode 24a, the offset spacers 15, the sidewall spacers 17a, and the first insulating film 21.

Contact holes CH that reach the refractory metal silicide layer 20 on the source and drain regions 19 are provided through the upper insulating film 25 and the first insulating film 21. Furthermore, plugs 26 and upper interconnects 27 that are composed of an electrically-conductive material such as a metal are formed.

The first insulating film 21 is composed of an insulating material having higher resistance against a hydrofluoric acid compared with silicon oxide. For example, it is composed of an insulating material containing any of silicon nitride, silicon nitride doped with boron, silicon carbide, silicon carbonitride, and silicon oxycarbide.

The offset spacers 15, the sidewall spacers 17a, and the first insulating film 21 are planarized, and the gate electrode 24a is flush with these insulating films.

For example, the offset spacers 15 are used as the mask for forming the extension regions. The positions of the end surfaces of the offset spacers 15 on the opposite side to the gate electrode 24a substantially determine the positions of the ends of the extension regions 16 on the channel side, although depending on the condition of activation thermal treatment and so on. The sidewall spacers 17a are used as the mask for forming the source and drain regions. The positions of the end surfaces of the sidewall spacers 17a on the opposite side to the gate electrode 24a substantially determine the positions of the ends of the source and drain regions 19 on the channel side.

The semiconductor device according to the present embodiment has a MOS transistor fabricated by a damascene gate process, which can employ a High-k film as its gate insulating film.

A method for manufacturing a semiconductor device according to the present embodiment will be described below with reference to the drawings.

Figure 2A:
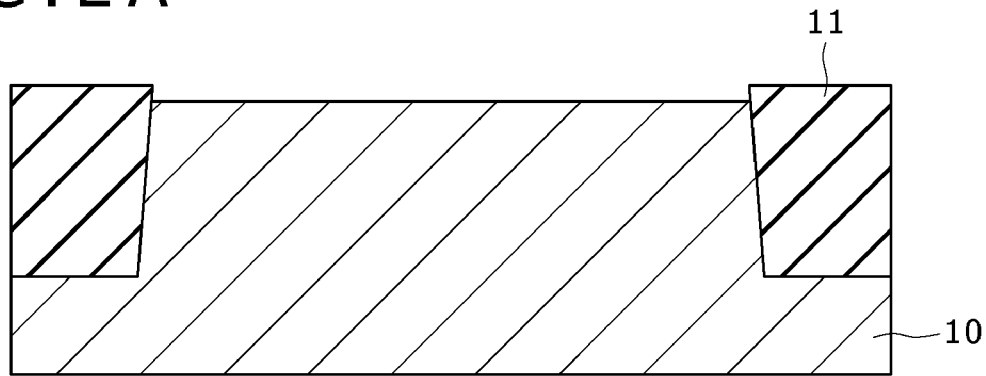
FIGS. 2A to 2C are sectional views showing steps in a method for manufacturing a semiconductor device according to the embodiment of the present invention.

Initially, as shown in FIG. 2A, for example, in the silicon semiconductor substrate 10 having a channel forming region, the element-isolation insulating film 11 for separating active regions is formed by STI.

In the STI, for example, a silicon oxide film (not shown) is formed on the semiconductor substrate 10 by dry oxidation, and a silicon nitride film (not shown) is formed by low-pressure chemical vapor deposition (CVD). Subsequently, a resist film (not shown) that protects the part in which the active region is to be formed is formed as a pattern, and etching of the silicon nitride, the silicon oxide, and the semiconductor substrate is sequentially performed with use of this resist film as the etching mask, to thereby form element isolation trenches. The depth of the element isolation trench is set to e.g. about 100 to 400 nm.

Subsequently, for example, silicon oxide with a thickness in the range of 650 to 700 nm is so deposited by high-density plasma CVD or the like as to fill the element isolation trenches, and polishing by chemical mechanical polishing (CMP) is performed to planarize the surface. This provides the element-isolation insulating film 11 composed of silicon oxide. At this time, the polishing is carried out until the silicon oxide film over the silicon nitride film can be removed above the active region for example.

In the formation of the element-isolation insulating film 11, for example, in order to reduce level difference in the wafer plane in the CMP step, so-called global level difference, the silicon oxide over the wide active region may be removed in advance e.g. by forming a pattern of a resist film by a photolithography step and then performing etching.

Subsequently to the formation of the element-isolation insulating film 11, for example, the silicon nitride film is removed by a hot phosphoric acid to thereby expose the semiconductor substrate above the active region. Before the removal of the silicon nitride film, densification of the silicon oxide film and rounding of corner parts of the active region may be carried out by annealing in nitrogen, oxygen, or hydrogen/oxygen.

Subsequently, for example, a silicon oxide film having a thickness of about 8 to 10 nm is formed on the semiconductor substrate surface above the active region. Furthermore, formation of a p- or n-well, formation of a buried layer for prevention of punch-through, and/or ion-implantation of an electrically-conductive impurity for threshold adjustment are carried out according to need.

Figure 2B:
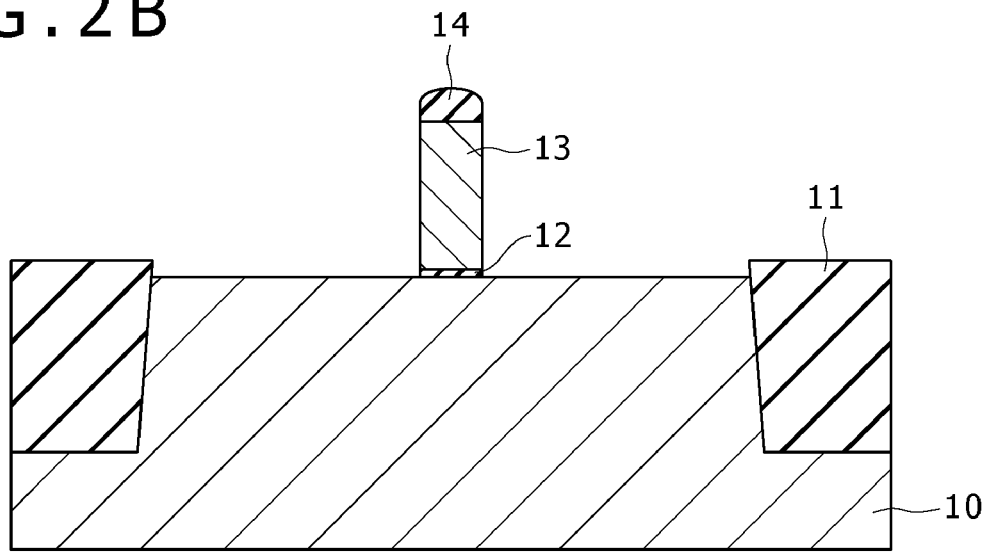

Next, as shown in FIG. 2B, for example, a silicon oxide film having a thickness of about 1 to 3 nm is formed over the entire surface by thermal oxidation. In addition, poly-silicon is deposited to a thickness in the range of 100 to 150 nm by low-pressure CVD in which silane is used as the source gas and the deposition temperature is in the range of 580 to 650° C., and silicon nitride is deposited to a thickness in the range of 50 to 100 nm by low-pressure CVD.

Subsequently, for example, a resist film that protects the gate forming region is formed by photolithography, and pattern-processing is carried out by anisotropic etching with an HBr or Cl gas. Thereby, over the gate electrode forming region of the active region of the semiconductor substrate 10, a dummy gate insulating film 12 composed of silicon oxide, a dummy gate electrode 13 composed of poly-silicon, and a hard mask layer 14 composed of silicon nitride are stacked.

After the formation of this resist film, the width of the resist film may be decreased by trimming with use of oxygen plasma. For example, in the 32-nm-node technique, it is also possible to set the gate length to about 20 to 30 nm.

Figure 2C:
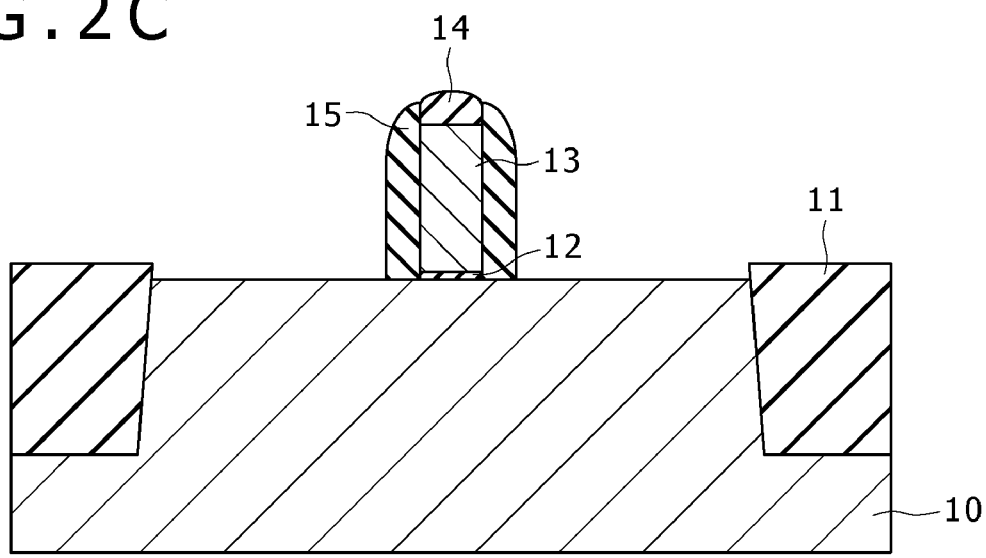

Next, as shown in FIG. 2C, for example, the offset spacers 15 in contact with the semiconductor substrate 10 are formed on both the sides of the dummy gate electrode 13 by depositing silicon nitride having a thickness in the range of 6 to 10 nm over the entire surface by low-pressure CVD and performing etch-back for the entire surface.

Figure 3A:
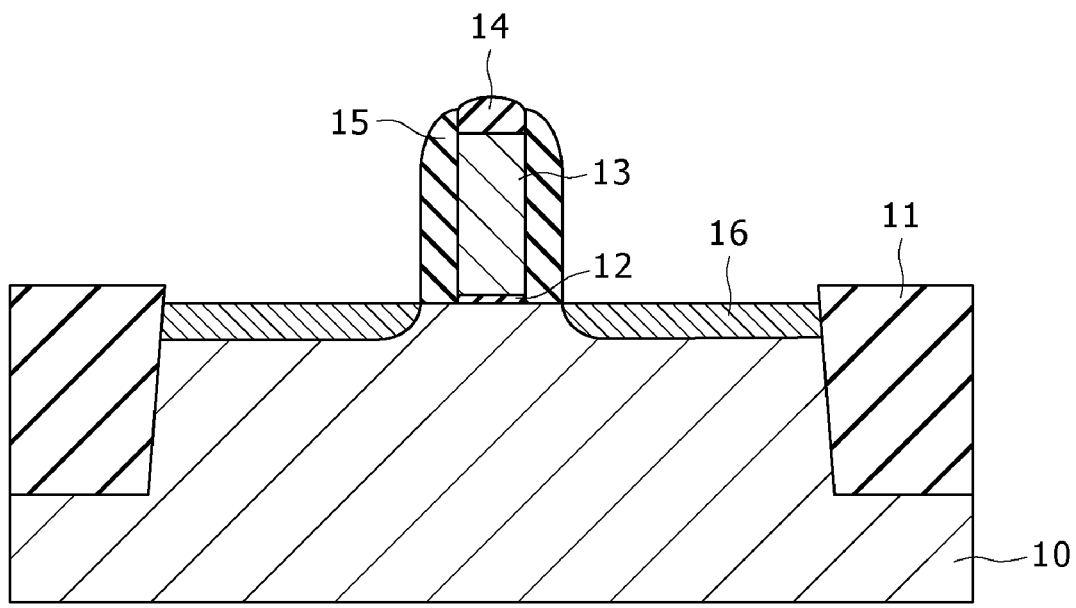
FIGS. 3A and 3B are sectional views showing steps in the method for manufacturing a semiconductor device according to the embodiment of the present invention.

Next, as shown in FIG. 3A, for example, pocket layers (Halo, not shown) and the extension regions 16 are formed in the semiconductor substrate 10 by ion-implantation of an impurity into the active region with use of the offset spacers 15 and the hard mask layer 14 as the implantation mask.

Figure 3B:
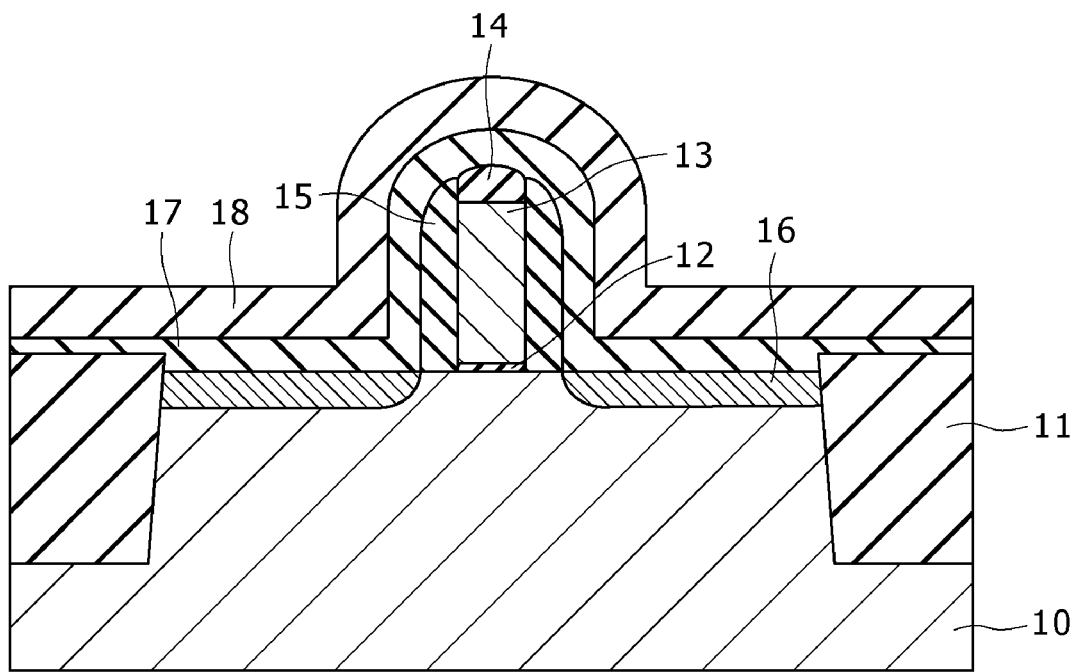

Subsequently, as shown in FIG. 3B, for example, a silicon nitride film 17 having a thickness in the range of 15 to 30 nm is formed over the entire surface by low-pressure CVD, and a silicon oxide film 18 having a thickness in the range of 40 to 60 nm is formed by CVD in which tetraethylorthosilicate (TEOS) is used as the source gas.

Figure 4A:
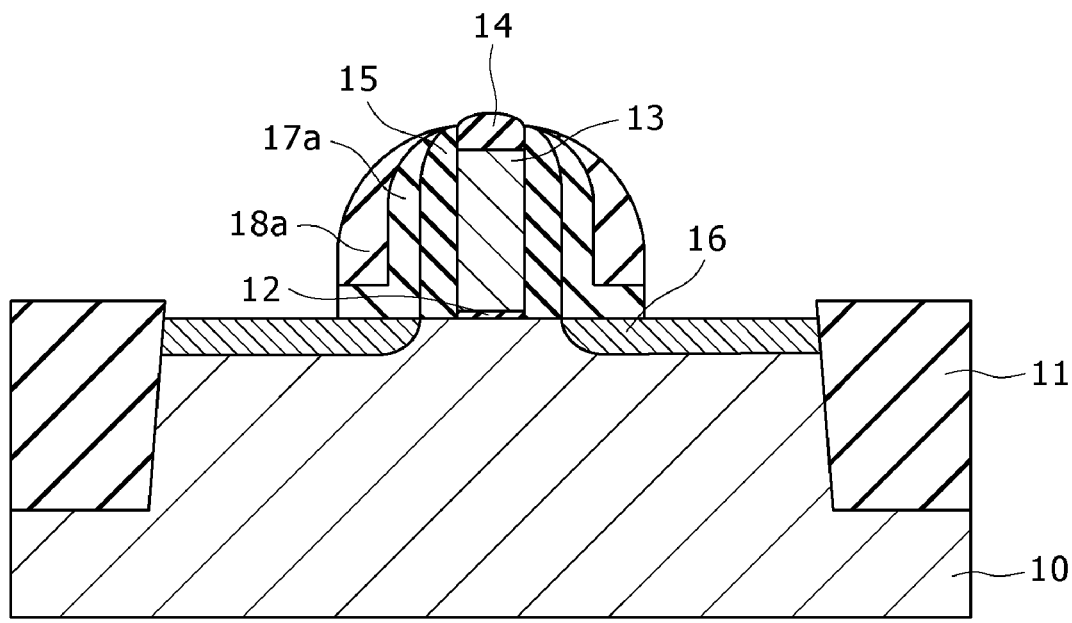
FIGS. 4A and 4B are sectional views showing steps in the method for manufacturing a semiconductor device according to the embodiment of the present invention.

Next, as shown in FIG. 4A, for example, etch-back of the silicon oxide film 18 and the silicon nitride film 17 is performed for the entire surface, to thereby form sidewall spacers that are in contact with the semiconductor substrate 10 and have a silicon nitride film 17a and a silicon oxide film 18a on both the sides of the offset spacers 15. The sidewall spacers may be formed of an insulating film arising from stacking of three layers of e.g. silicon oxide film/silicon nitride film/silicon oxide film.

Figure 4B:
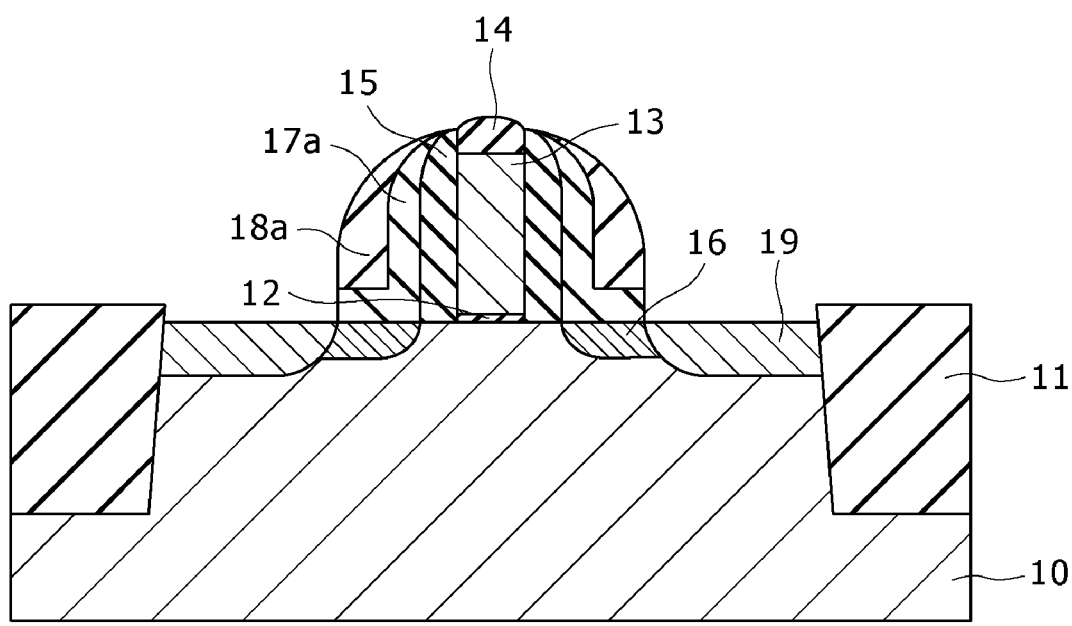

Next, as shown in FIG. 4B, for example, the source and drain regions 19 are formed in the semiconductor substrate 10 by ion-implantation of an impurity into the active region with use of the sidewall spacers (the silicon nitride film 17a and the silicon oxide film 18a), the offset spacers 15, and the hard mask layer 14 as the implantation mask.

In this manner, the source and drain regions 19 having the extension regions 16 are formed in a partial portion of the semiconductor substrate 10 below the offset spacers 15 and the sidewall spacers.

Figure 5A:
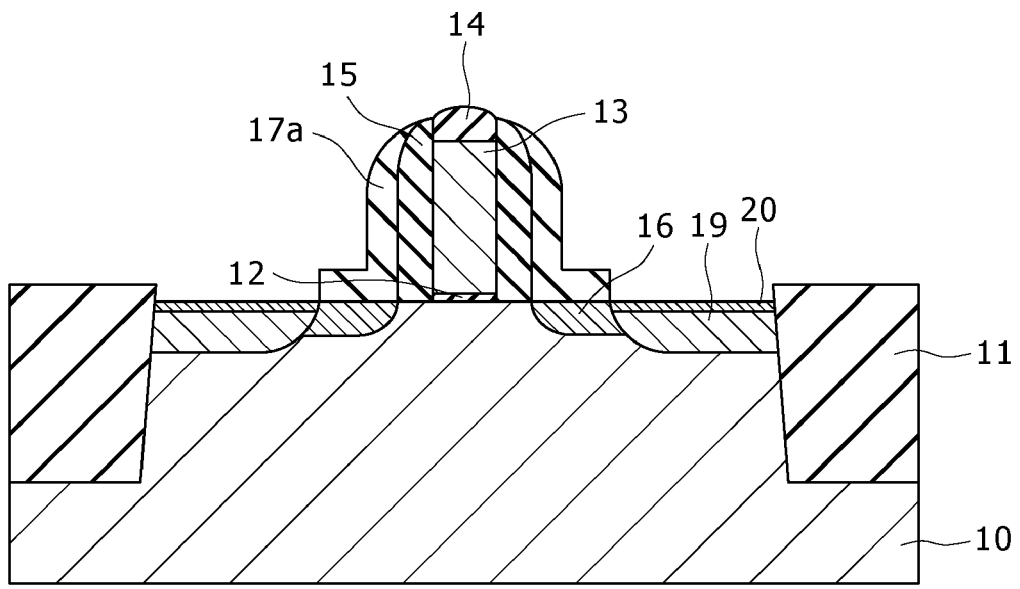
FIGS. 5A and 5B are sectional views showing steps in the method for manufacturing a semiconductor device according to the embodiment of the present invention.

Subsequently, as shown in FIG. 5A, for example, the resist film used for the ion-implantation is separated, and the silicon oxide film 18a as a part of the sidewall spacers and the other exposed silicon oxide film are removed by diluted hydrofluoric acid (DHF) treatment. Furthermore, thermal treatment such as spike rapid thermal annealing (RTA) treatment (1050° C.) is carried out for activation of the impurities.

Although the silicon oxide film 18a as a part of the sidewall spacers is removed by this DHF treatment, the component formed only of the silicon nitride film 17a will also be often referred to as the sidewall spacer in the description of the subsequent steps and the final from of the semiconductor device.

Subsequently, for example, cobalt (Co) is deposited by sputtering over the entire surface to a thickness in the range of 6 to 9 nm, and silicidation (to CoSi) across the interface between the silicon and the refractory metal on the surface of the source and drain regions is caused by RTA treatment at 500 to 600° C. for about 30 seconds, so that the refractory metal silicide layer 20 is formed. Thereafter, the unreacted refractory metal is removed by e.g. treatment with sulfuric acid/hydrogen peroxide. Furthermore, the CoSi is turned to $CoSi_2$, which has lower resistance, by RTA treatment at 650 to 850° C., so that the desired refractory metal silicide layer 20 is formed.

Alternatively, NiSi may be formed by depositing Ni or NiPt instead of Co.

Figure 5B:
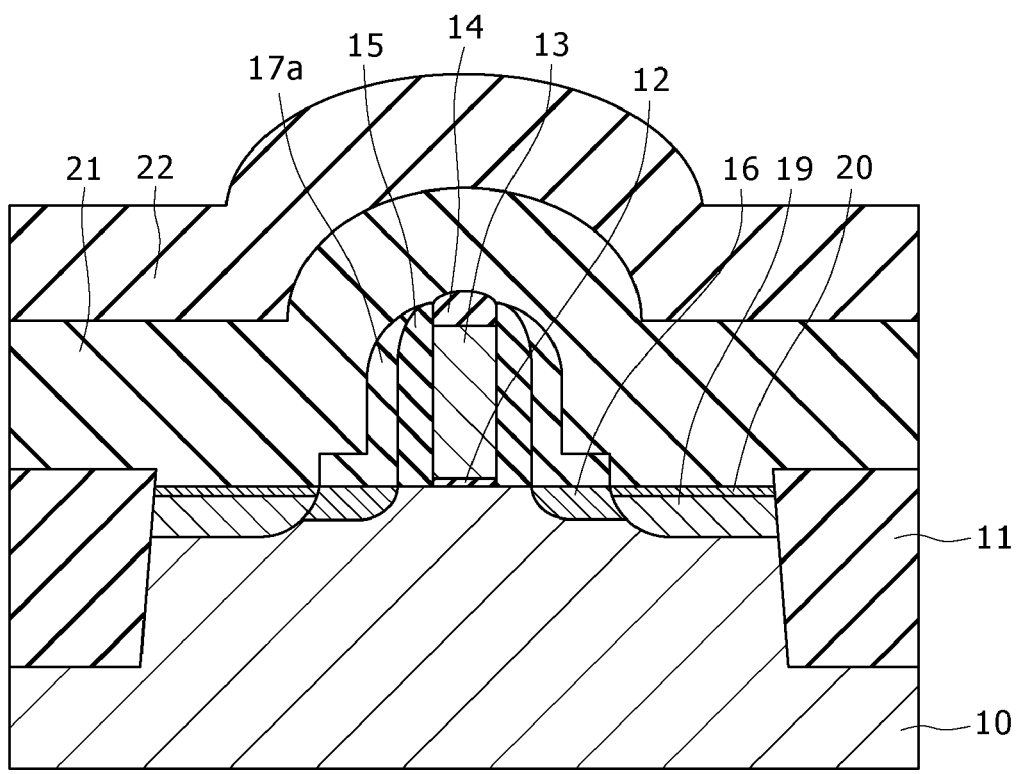

Subsequently, as shown in FIG. 5B, for example, the first insulating film 21 is formed over the entire surface by using an insulating material having higher resistance against a hydrofluoric acid than silicon oxide. The first insulating film 21 is so formed as to have a thickness larger than that of the dummy gate electrode 13 and cover the dummy gate electrode (the hard mask layer 14). For example, the first insulating film 21 is formed by depositing silicon nitride having a thickness in the range of 100 to 150 nm.

The first insulating film 21, which is formed by using an insulating material having higher resistance against a hydrofluoric acid than silicon oxide, may be formed by using, instead of silicon nitride, an insulating material containing any of silicon nitride doped with boron, silicon carbide, silicon carbonitride, and silicon oxycarbide.

The conditions of the film deposition of the silicon nitride film are as follows, e.g. in the case of using low-pressure CVD in which hexadichlorosilane (HCD) is used as the source gas.

Treatment temperature: 450 to 600° C.

Pressure: 10 to 200 Pa

Flow rates: HCD=10 to 100 cc, $NH_3$=100 to 1000 cc, $N_2$=100 to 500 cc

Furthermore, the conditions are as follows in the case of using plasma CVD.

Treatment temperature: 300 to 500° C.

Pressure: 1 to 10 Torr

Power: 500 to 1000 W

Flow rates: $SiH_4$=100 to 2000 sccm, $NH_3$=100 to 2000 sccm

In addition, the conditions are as follows in the case of using ALD.

Treatment temperature: 400 to 600° C.

Pressure: 10 to 200 Pa

Flow rates: $SiH_2Cl_2$=10 to 100 cc, $NH_3$=100 to 1000 sccm, $N_2$=100 to 500 cc Subsequently to the formation of the first insulating film 21, for example, a second insulating film 22 is formed on the first insulating film 21 by using an insulating material different from that of the first insulating film.

For example, the second insulating film 22 is formed by depositing silicon oxide having a thickness in the range of 50 to 300 nm by CVD.

The conditions of the film deposition of the silicon oxide film are as follows for example.

Figure 6A:
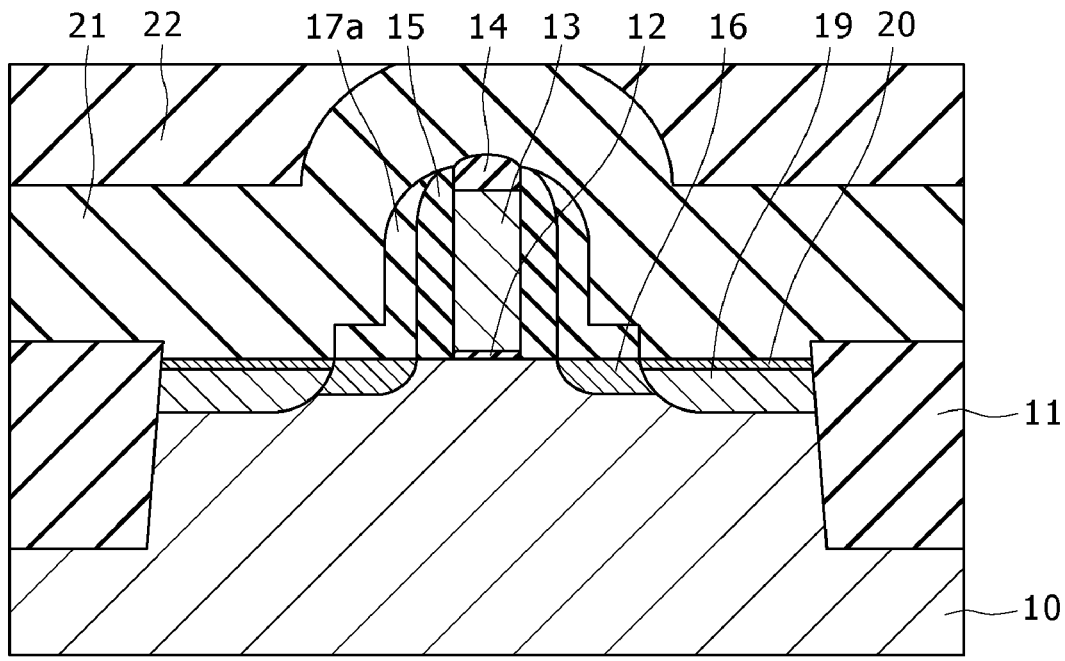
FIGS. 6A and 6B are sectional views showing steps in the method for manufacturing a semiconductor device according to the embodiment of the present invention.

Treatment temperature: 400 to 550° C.
Pressure: 10 to 300 Torr
Flow rates: TEOS=1 to 5 g, $O_3$=1000 to 30000 sccm Next, as shown in FIG. 6A, for example, by CMP treatment under a condition to remove silicon oxide with a high selection ratio with respect to silicon nitride, polishing is carried out from the top surface of the second insulating film 22 until the top part of the first insulating film 21 is exposed, so that the second insulating film is removed by the polishing.

The exposure of the top part of the first insulating film 21 can be detected based on the change of the torque of the polishing, and the insulating films can be planarized through the polishing of the second insulating film 22 as described above.

Besides the polishing, etching such as isotropic etching may be performed.

If the second insulating film 22 is composed of silicon oxide, the CMP treatment can be performed under the following conditions for example.

Figure 6B:
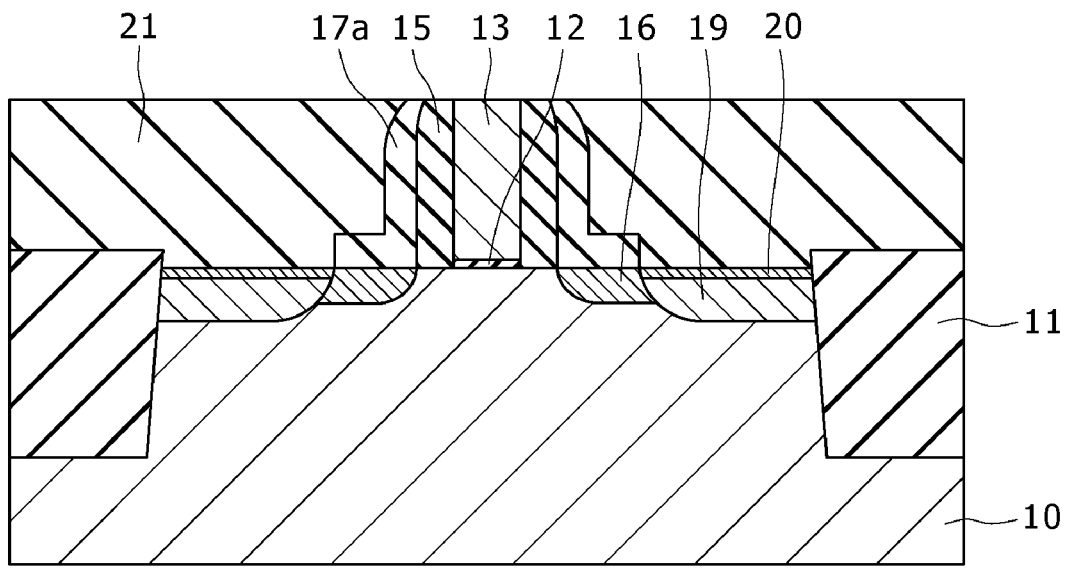

Polishing pressure: 100 to 500 hPa
Rotation speeds: 50 to 150 rpm for platen, 50 to 150 rpm for polishing head
Polishing pad: foamed polyurethane resin
Slurry: cerium oxide slurry
Flow rate: 100 to 300 cc/minute
Temperature: 25 to 30° C.
Polishing time: torque end point is used Subsequently, as shown in FIG. 6B, for example, the first insulating film 21 and the remaining second insulating film 22 are removed by polishing, while being planarized, until the dummy gate electrode 13 is exposed by CMP treatment in which the selection ratio of silicon oxide to silicon nitride is 1:1.

The exposure of the top part of the dummy gate electrode 13 can be detected based on the change of the torque of the polishing, and the insulating films can be planarized through the polishing of the first insulating film 21 and the remaining second insulating film 22 as described above.

Besides the polishing, etching such as isotropic etching may be performed.

In the above-described manner, the offset spacers 15, the sidewall spacers 17a, and the first insulating film 21 can be planarized.

If the first insulating film 21 is composed of silicon nitride and the second insulating film 22 is composed of silicon oxide, the CMP treatment can be performed under the following conditions for example.

Figure 7A:
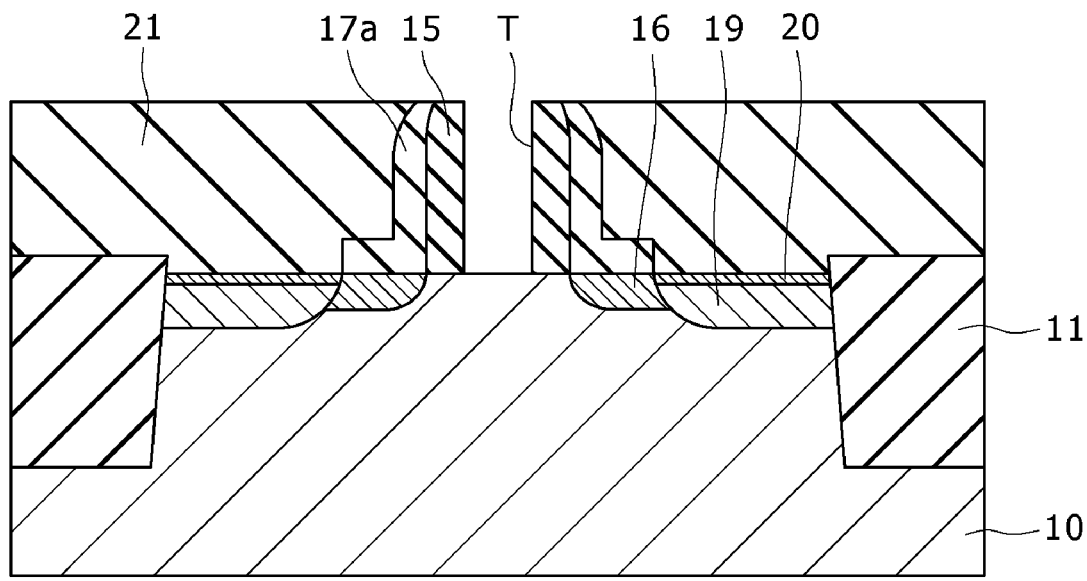
FIGS. 7A and 7B are sectional views showing steps in the method for manufacturing a semiconductor device according to the embodiment of the present invention.

Polishing pressure: 100 to 500 hPa
Rotation speeds: 50 to 150 rpm for platen, 50 to 150 rpm for polishing head
Polishing pad: foamed polyurethane resin
Slurry: silica slurry
Flow rate: 100 to 300 cc/minute
Temperature: 25 to 30° C.
Polishing time: torque end point is used Subsequently, as shown in FIG. 7A, for example, the dummy gate electrode 13 composed of poly-silicon or the like is removed by chemical dry etching treatment. In this etching, an etching condition that offers a sufficiently-high selection ratio with respect to the dummy gate insulating film composed of silicon oxide is employed.

Furthermore, the dummy gate insulating film 12 is removed e.g. by etching treatment with use of a chemical based on a hydrofluoric acid.

In this manner, the gate electrode trench T is formed in the area between the pair of offset spacers 15.

Because the first insulating film 21 is composed of an insulating material having higher resistance against a hydrofluoric acid than silicon oxide, it is possible to suppress the lowering of the surface level of the first insulating film 21 at the time of the removal of the dummy gate insulating film 12.

Figure 7B:
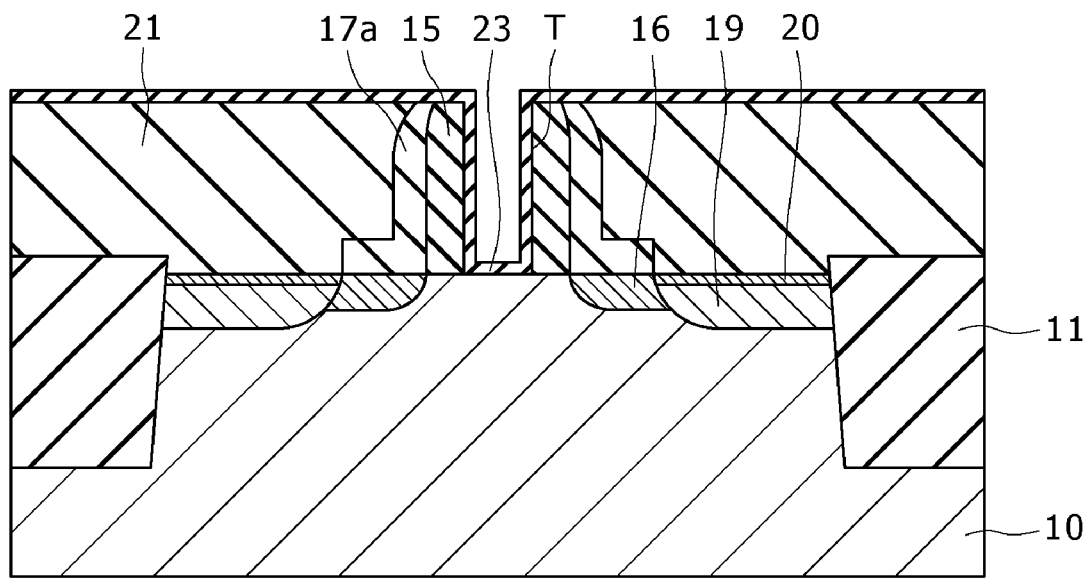

Next, as shown in FIG. 7B, for example, the gate insulating film 23 composed of silicon oxynitride is so formed by thermal oxidation as to cover the bottom of the gate electrode trench T. Alternatively, the gate insulating film 23 formed of a High-k film such as a hafnium oxide or aluminum oxide film is so formed by ALD as to cover the inside surface of the gate electrode trench T. If a High-k film is employed as the gate insulating film 23, treatment temperatures lower than 500° C. are employed in the steps after the formation of this High-k film, because the heat resistance of the High-k film is low.

Figure 8A:
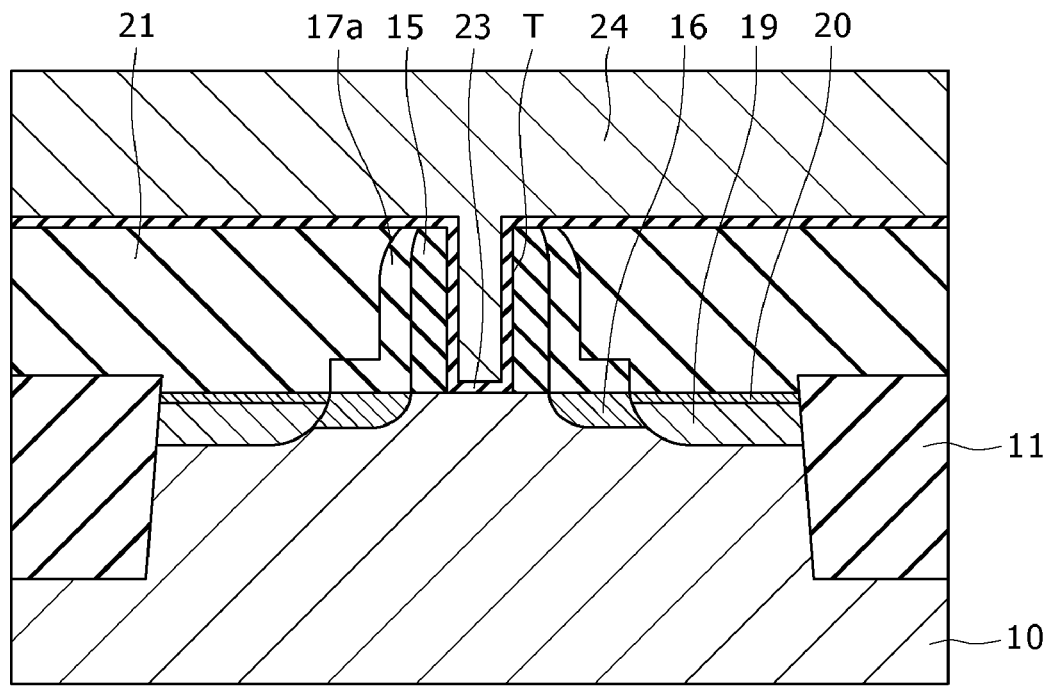
FIGS. 8A and 8B are sectional views showing steps in the method for manufacturing a semiconductor device according to the embodiment of the present invention.

Subsequently, as shown in FIG. 8A, for example, hafnium silicide (HfSix) is deposited by sputtering or CVD or titanium nitride is deposited by ALD on the gate insulating film 23 inside and outside the gate electrode trench T, to thereby form an electrically-conductive layer 24 having a thickness in the range of 5 to 50 nm.

Figure 8B:
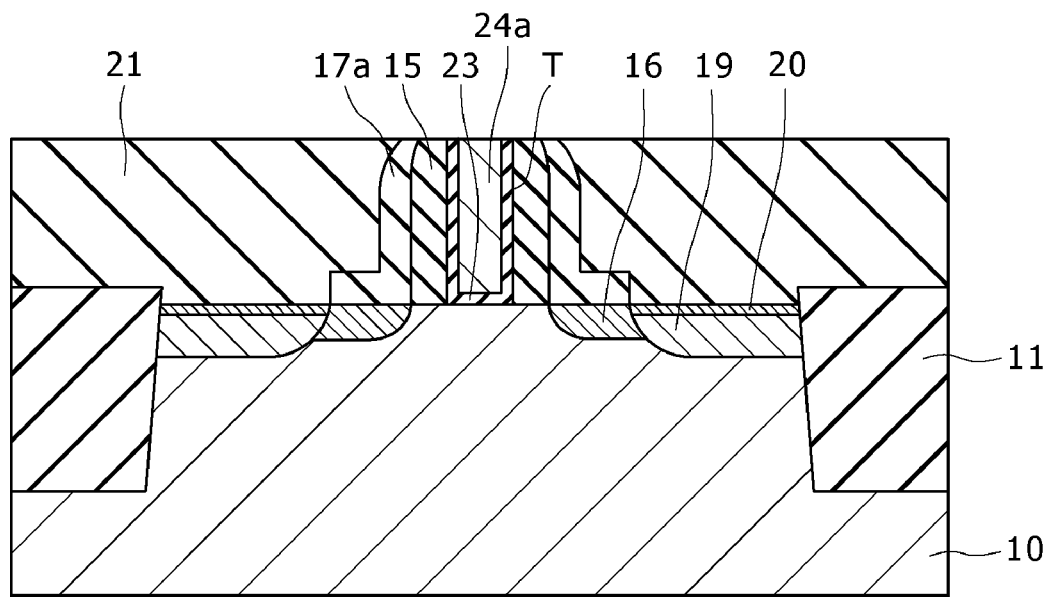

Next, as shown in FIG. 8B, for example, the conductive layer 24 is polished by CMP treatment from the top surface thereof to thereby remove the conductive layer 24 deposited outside the gate electrode trench T, so that the gate electrode 24a buried in the gate electrode trench T is formed.

Figure 9A:
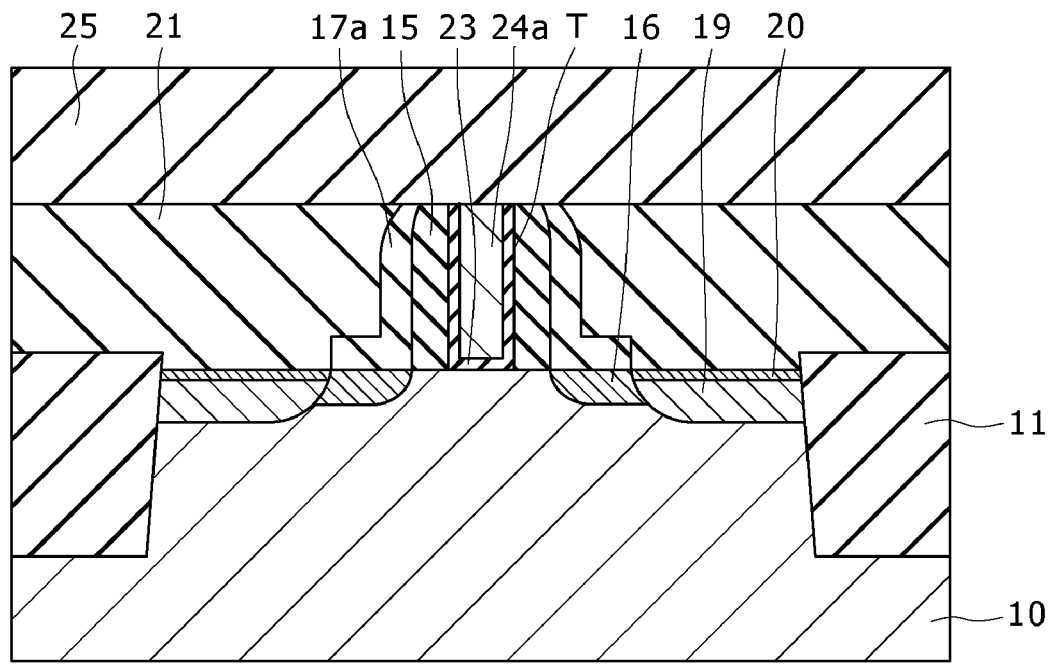
FIGS. 9A and 9B are sectional views showing steps in the method for manufacturing a semiconductor device according to the embodiment of the present invention.

Subsequently, as shown in FIG. 9A, for example, the upper insulating film 25 is formed by depositing silicon oxide by CVD to a thickness in the range of 200 to 1000 nm on the gate electrode 24a, the offset spacers 15, the sidewall spacers 17a, and the first insulating film 21.

According to need, the surface of the upper insulating film 25 is so polished and planarized by CMP that the upper insulating film 25 has a thickness of about 100 to 800 nm above the gate electrode 24a.

Figure 9B:
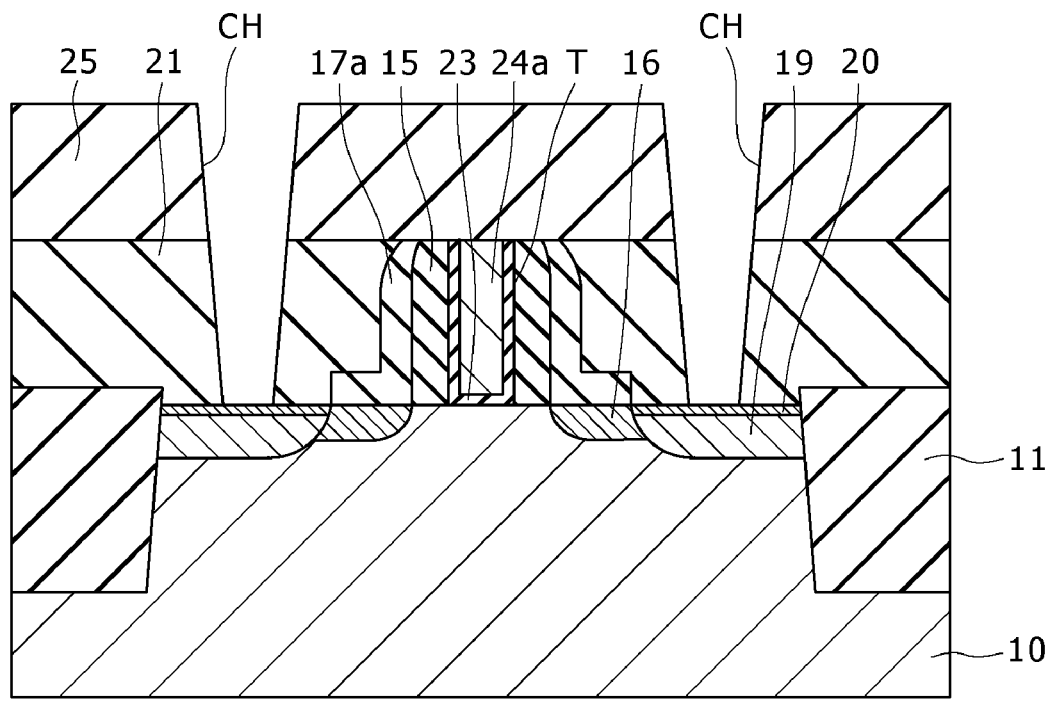
Figure 10A:
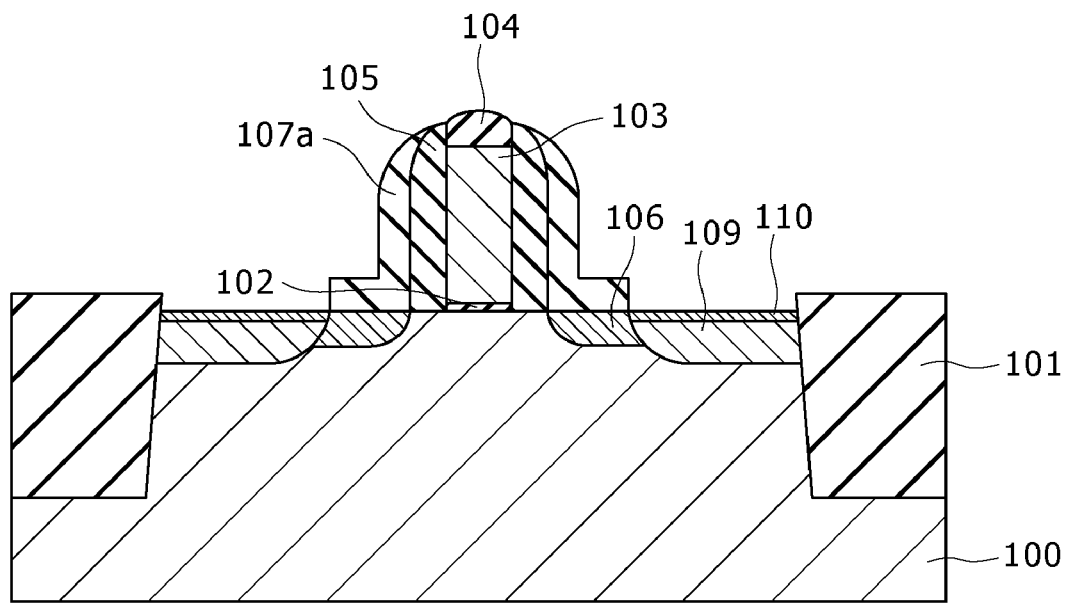
FIGS. 10A and 10B are sectional views showing steps in a method for manufacturing a semiconductor device according to a related art.
Figure 10B:
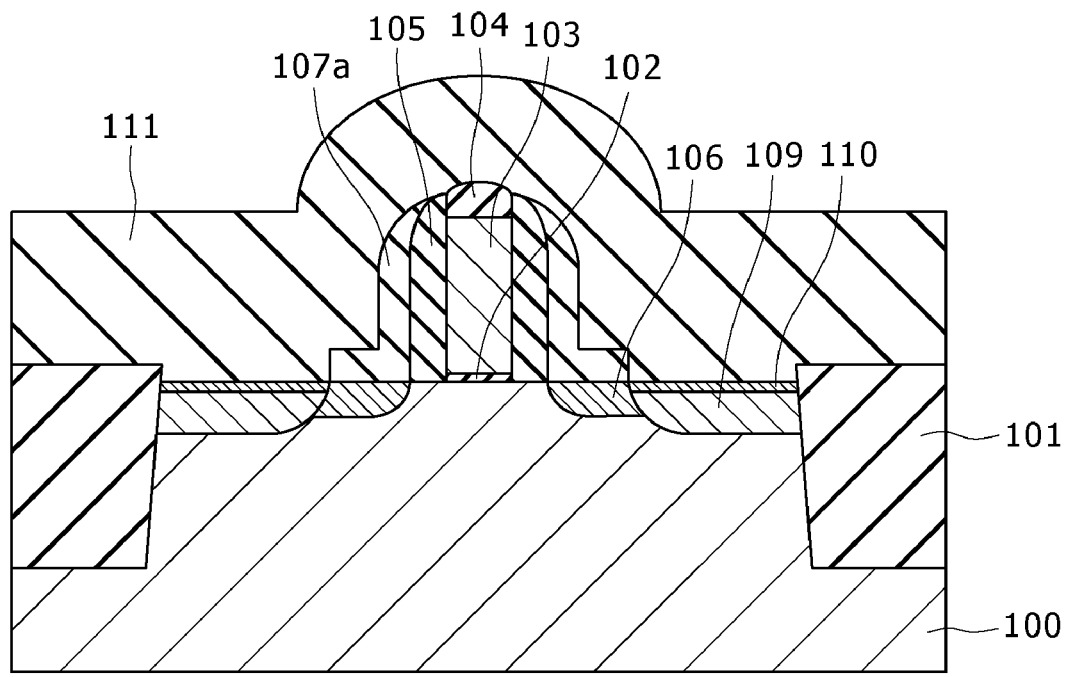
Figure 11A:
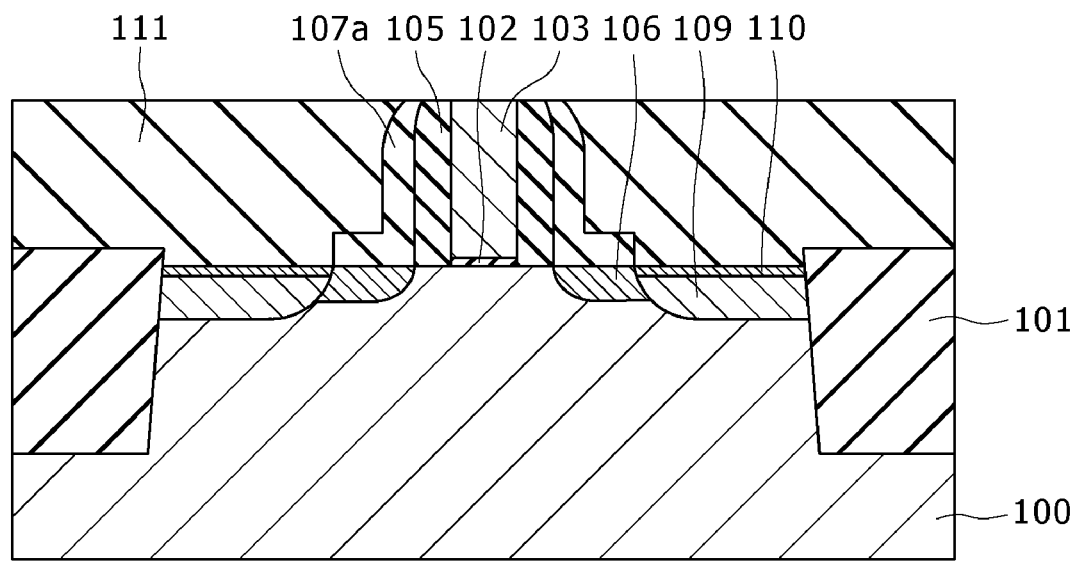
FIGS. 11A and 11B are sectional views showing steps in the method for manufacturing a semiconductor device according to the related art.
Figure 11B:
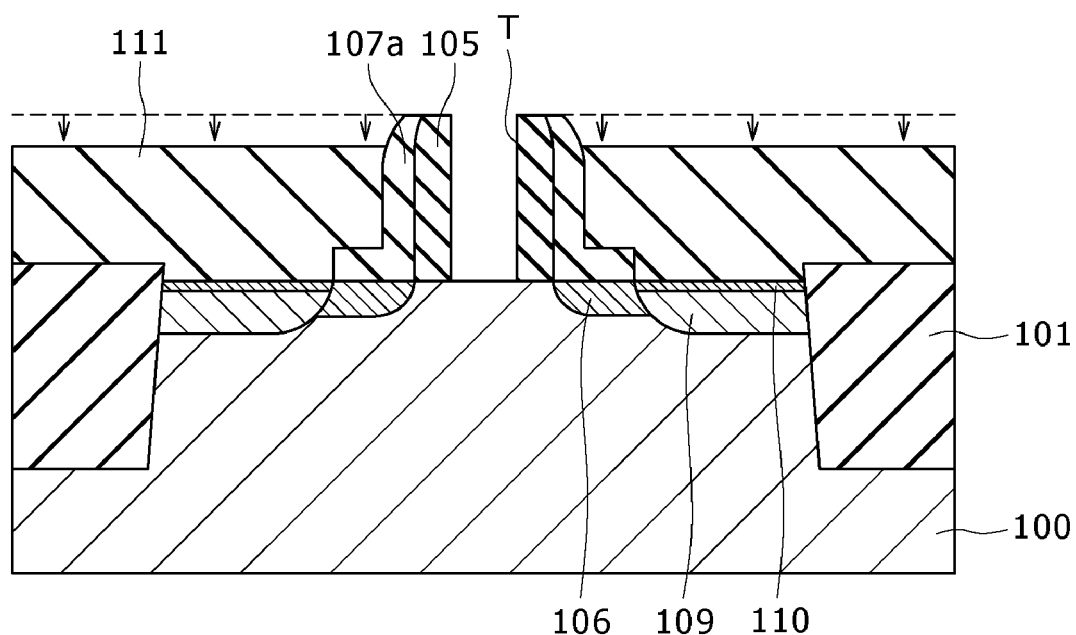
Figure 12A:
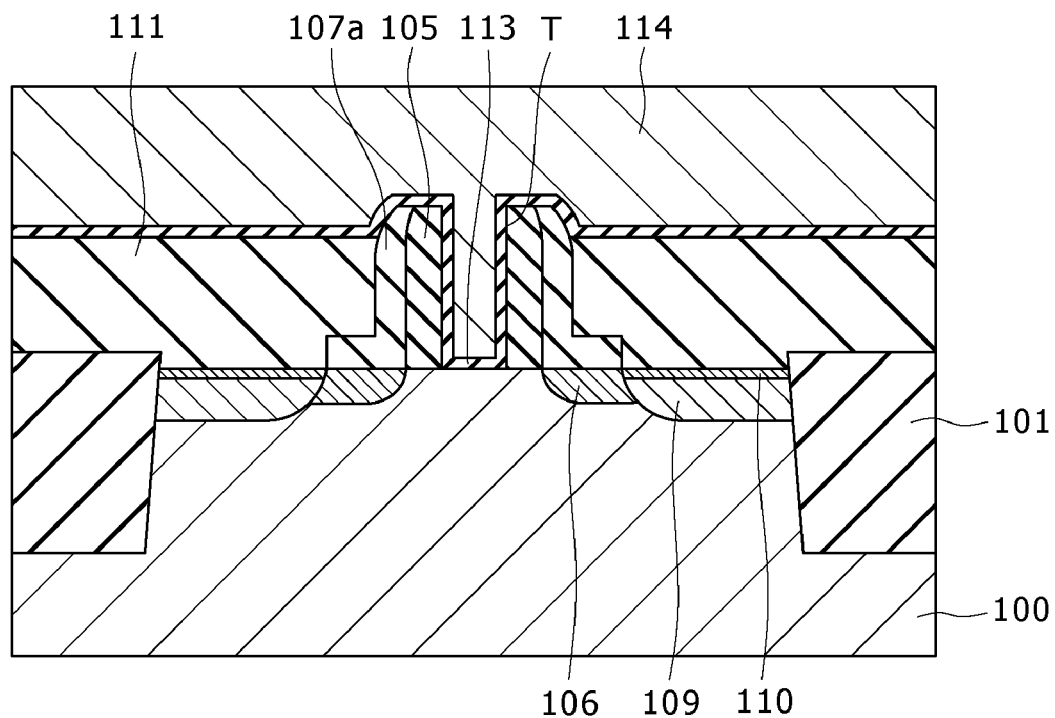
FIGS. 12A and 12B are sectional views showing steps in the method for manufacturing a semiconductor device according to the related art.
Figure 12B:
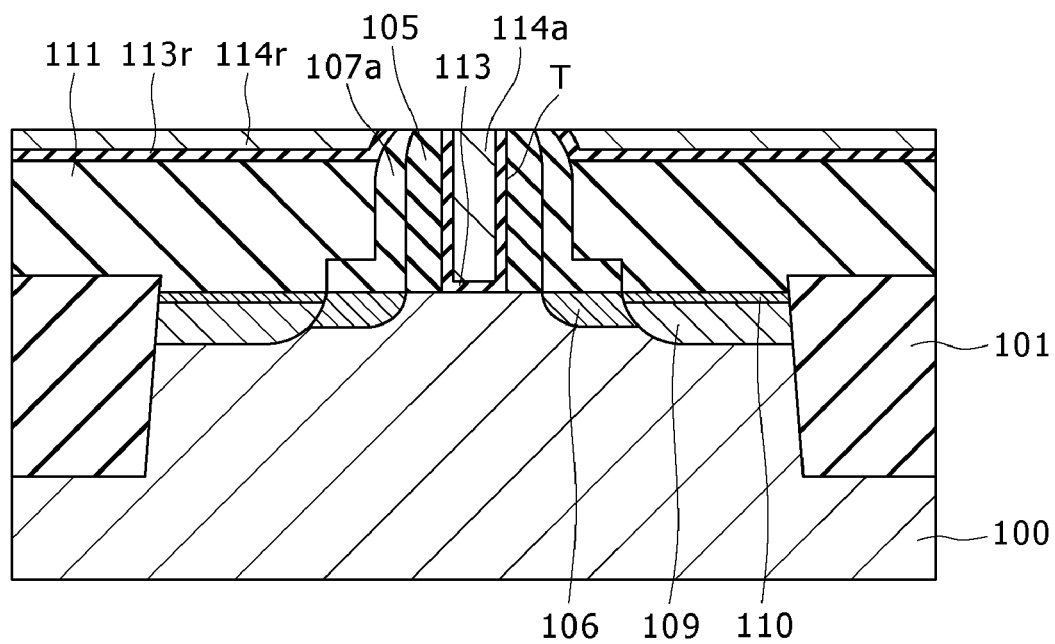
Figure 13A:
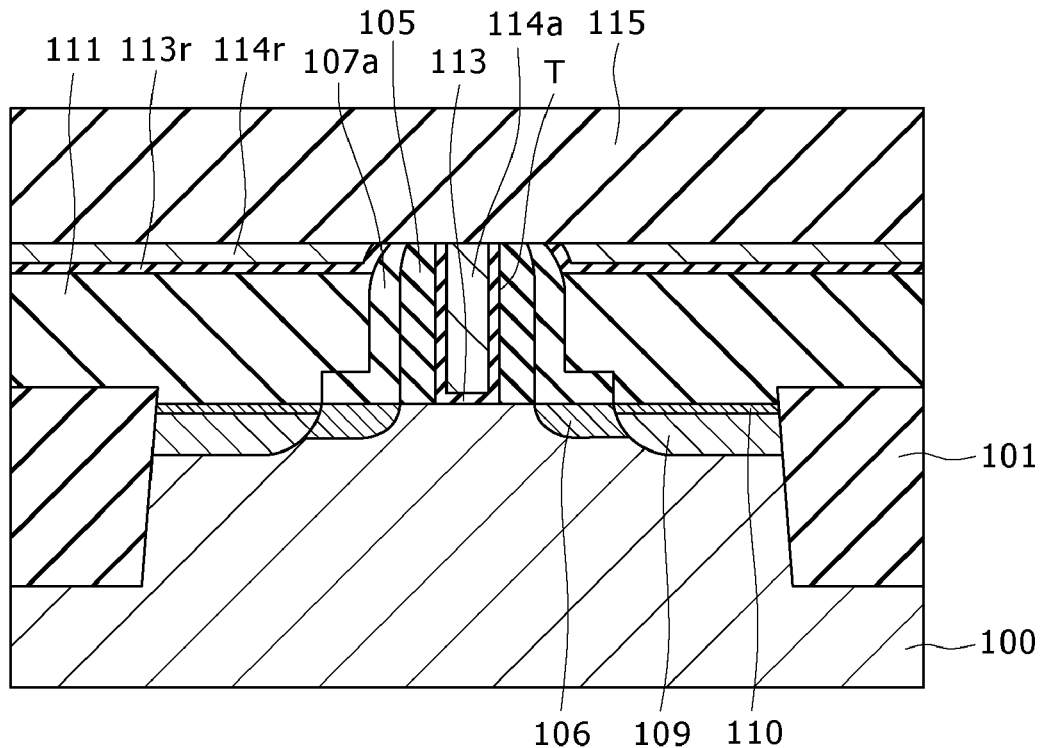
FIGS. 13A and 13B are sectional views showing steps in the method for manufacturing a semiconductor device according to the related art.
Figure 13B:
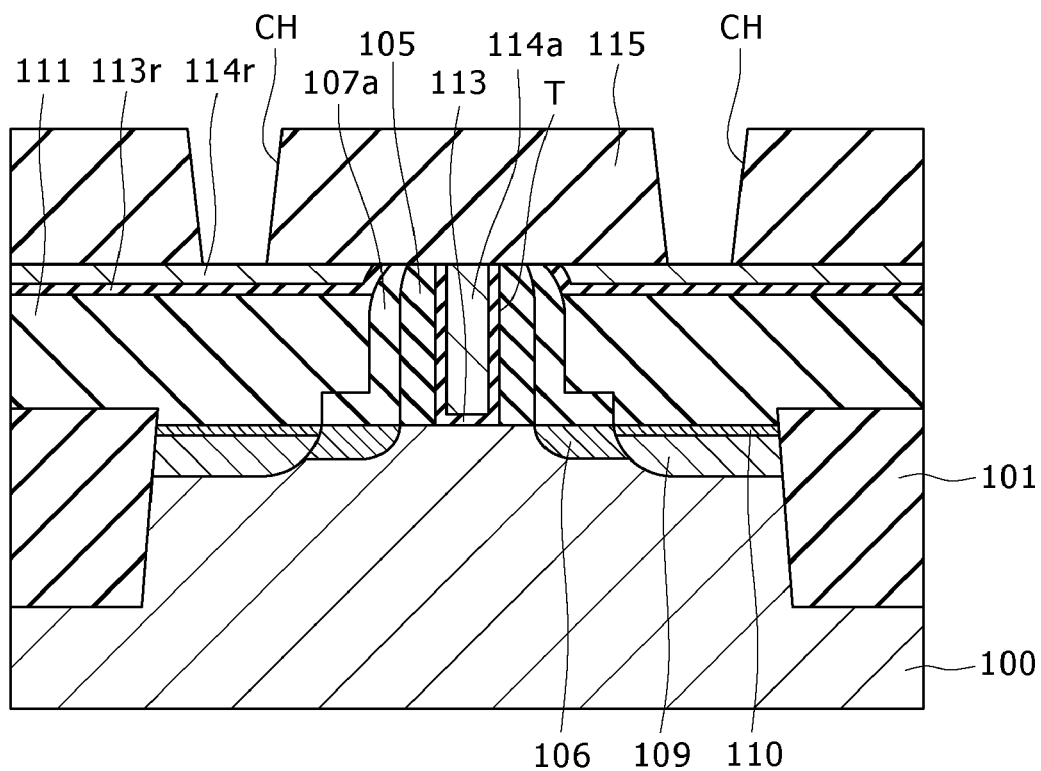

Next, as shown in FIG. 9B, for example, a resist film (not shown) having an aperture pattern corresponding to the contact hole pattern is formed by a photolithography step. Subsequently, by dry etching treatment such as reactive ion etching (RIE), the contact holes CH are formed that penetrate the upper insulating film 25 and the first insulating film 21 and reach the refractory metal silicide layer 20 or the like on the source and drain regions 19.

For example, if a silicon nitride film is formed in advance on the refractory metal silicide layer 20 and then the contact holes are opened under a condition that allows ensuring of a high selection ratio with respect to silicon nitride, the etching can be stopped at the surface of this silicon nitride film. After this etching, etching for removing silicon nitride is performed by the depth equivalent to the thickness of the silicon nitride film. This procedure can prevent excessive etching into the refractory metal silicide layer 20 and can decrease the amount of compensating ion-implantation for reduction in the junction leakage.

Subsequently to the opening of the contact holes CH, for example, Ti or TiN is deposited by CVD and W is deposited, followed by planarization polishing by CMP treatment. Thereby, the plugs 26 composed of W or the like are formed with the intermediary of an adhesive layer to the underlying layer.

As the method for forming Ti or TiN, e.g. sputtering employing IMP may be used instead of CVD. As the method for forming the plugs 26, etch-back across the entire surface by which the conductive layer deposited outside the contact holes is removed may be used.

Subsequently, for example, the upper interconnects 27 are formed by using an interconnect material such as Al.

It is also possible to form e.g. a Cu interconnect as the upper interconnects by using a damascene process.

Through the above-described steps, the same semiconductor device as that having the structure shown in FIG. 1 can be manufactured.

In the method for manufacturing a semiconductor device according to the embodiment of the present invention, the lowering of the surface level of the interlayer insulating film at the time of the formation of the gate electrode trench does not occur in a damascene gate process. Thus, a conductive layer residue that possibly causes short-circuiting is not generated, and therefore contact holes can be easily opened.

Furthermore, the heights of the first insulating film, the offset sidewalls, and so on can be uniformed, and thus it is also possible to reduce variation in the height of the gate electrode obtained by the damascene gate process.

The present invention is not limited to the above description.

Although planarization polishing is performed after the first and second insulating films are stacked in the above-described embodiment, polishing may be performed after only the first insulating film is deposited. Because the first insulating film has higher resistance against a hydrofluoric acid than silicon oxide, the surface level lowering thereof at the time of the removal of the dummy gate insulating film can be prevented. In this case, a larger thickness of the first insulating film can provide higher planarity at the time of the planarization polishing.

However, if silicon nitride or the like having too large a thickness is deposited as the first insulating film, the time required for the polishing becomes too long. Therefore, by stacking the first insulating film composed of silicon nitride or the like and the second insulating film composed of silicon oxide or the like as with in the above-described embodiment, the time required for the polishing can be shortened, and the occurrence of dishing at the time of the polishing can be suppressed, which allows achievement of higher planarity.

Furthermore, for example, the materials of the gate insulating film and the gate electrode are not limited to the above-described embodiment.

The forming of the refractory metal silicide layer is not essential.

In addition, other various changes may be made without departing from the gist of the present invention.

The method for manufacturing a semiconductor device according to the embodiment of the present invention can be applied to a method for manufacturing a semiconductor device having a MOSFET.

It should be understood by those skilled in the art that various modifications, combinations, sub-combinations and alterations may occur depending on design requirements and other factors insofar as they are within the scope of the appended claims or the equivalents thereof.

What is claimed is:

1. A method for manufacturing a semiconductor device, the method comprising the steps of:
    forming a dummy gate insulating film and a dummy gate electrode over a semiconductor substrate having a channel forming region;
    forming source and drain regions in the semiconductor substrate by using the dummy gate electrode as a mask;
    forming a first insulating film by using an insulating material having higher resistance against a hydrofluoric acid than silicon oxide in such a way that the first insulating film has a thickness larger than a thickness of the dummy gate electrode and covers the dummy gate electrode;
    forming a second insulating film on the first insulating film by using an insulating material different from the insulating material of the first insulating film;
    removing the second insulating film from a top surface of the second insulating film until a top part of the first insulating film is exposed;
    simultaneously removing the first insulating film and the second insulating film that remains, while planarizing the first insulating film and the second insulating film that remains, from a top surface of the first insulating film until the dummy gate electrode is exposed;
    forming a gate electrode trench by removing the dummy gate electrode and the dummy gate insulating film;
    forming a gate insulating film on a bottom of the gate electrode trench; and
    forming a gate electrode by filling an inside of the gate electrode trench above the gate insulating film with an electrically-conductive material, wherein
    a field effect transistor is formed by the method.

2. The method for manufacturing a semiconductor device according to claim 1, wherein
    the first insulating film and the second insulating film that remains are removed by polishing in the step of simultaneously removing the first insulating film and the second insulating film that remains.

3. The method for manufacturing a semiconductor device according to claim 1, wherein
    the second insulating film is removed by polishing in the step of removing the second insulating film.

4. The method for manufacturing a semiconductor device according to claim 1, further comprising the steps of, after the step of forming the dummy gate electrode and before the step of forming the source and drain regions:
    forming an offset spacer on both sides of the dummy gate electrode;
    forming an extension region in the semiconductor substrate by using the offset spacer and the dummy gate electrode as a mask; and
    forming a sidewall spacer on both sides of the offset spacer, wherein
    in the step of forming the source and drain regions, the sidewall spacer, the offset spacer, and the dummy gate electrode are used as a mask to thereby form the source and drain regions in the semiconductor substrate.

5. The method for manufacturing a semiconductor device according to claim 4, wherein
    the gate electrode trench is formed in an area between a pair of the offset spacers in the step of forming the gate electrode trench.

6. The method for manufacturing a semiconductor device according to claim 1, wherein
    the step of forming the gate electrode includes the sub-steps of:
    depositing an electrically-conductive material inside and outside the gate electrode trench above the gate insulating film; and
    removing the electrically-conductive material outside the gate electrode trench.

7. The method for manufacturing a semiconductor device according to claim 1, wherein the dummy gate insulating film is removed by a chemical based on a hydrofluoric acid in the step of forming the gate electrode trench.

8. The method for manufacturing a semiconductor device according to claim 1, wherein the first insulating film is formed by using an insulating material that contains any of silicon nitride, silicon nitride doped with boron, silicon carbide, silicon carbonitride, and silicon oxycarbide in the step of forming the first insulating film.

\* \* \* \* \*